United States Patent
Chung et al.

(10) Patent No.: US 9,437,399 B2
(45) Date of Patent: Sep. 6, 2016

(54) PLASMA EQUIPMENT

(71) Applicant: INDUSTRY-UNIVERSITY COOPERATION FOUNDATION HANYANG UNIVERSITY, Seoul (KR)

(72) Inventors: Chin-Wook Chung, Seoul (KR); Jin-Young Bang, Seoul (KR); Hee-Jin Lee, Daegu (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 14/400,306

(22) PCT Filed: May 16, 2013

(86) PCT No.: PCT/KR2013/004333
§ 371 (c)(1),
(2) Date: Nov. 10, 2014

(87) PCT Pub. No.: WO2013/172665
PCT Pub. Date: Nov. 21, 2013

(65) Prior Publication Data
US 2015/0097480 A1    Apr. 9, 2015

(30) Foreign Application Priority Data

May 17, 2012   (KR) .................. 10-2012-0052293

(51) Int. Cl.
*H01J 37/00*   (2006.01)
*H01J 37/32*   (2006.01)
(Continued)

(52) U.S. Cl.
CPC ........... *H01J 37/3211* (2013.01); *H01F 38/14* (2013.01); *H01J 37/32183* (2013.01); *H05H 1/46* (2013.01); *H01J 2237/327* (2013.01); *H05H 2001/4667* (2013.01)

(58) Field of Classification Search
CPC ...................................................... H01J 37/321
USPC .................... 315/34, 111.21, 111.41, 111.51
See application file for complete search history.

(56) References Cited

U.S. PATENT DOCUMENTS 6,353,206 B1 * 3/2002 Roderick .......... H01J 37/32082
                                                     219/121.43
6,451,161 B1 * 9/2002 Jeng ...................... H01J 37/321
                                                     118/723 L
(Continued)

FOREIGN PATENT DOCUMENTS

KR    10-2002-0010472 A    2/2002
KR    10-2007-0081209 A    8/2007

OTHER PUBLICATIONS

Translasion of Foregn References cited in IDS,Gu (KR 2002-0010472.*

(Continued)

*Primary Examiner* — Douglas W Owens
*Assistant Examiner* — Syed M Kaiser

(57) ABSTRACT

There is provided plasma equipment including a power supply that supplies a RF power; a chamber in which plasma is generated, and a processing target to processed by the plasma is provided; an antenna coil that is provided on a top surface of the chamber, and is connected to the power supply to receive the RF power; and a resonance coil that is provided to be electrically insulated or cut off from the antenna coil. The resonance coil receives electromagnetic energy applied from the antenna coil to allow a current to flow, and the plasma is generated within the chamber. It is possible to increase the degree of freedom for an installation position of the resonance coil, and it is possible to increase plasma density.

12 Claims, 10 Drawing Sheets

(51) Int. Cl.
*H01F 38/14* (2006.01)
*H05H 1/46* (2006.01)

(56) References Cited

U.S. PATENT DOCUMENTS

| | | | | |
|---|---|---|---|---|
| 2001/0052394 A1* | 12/2001 | Jung | ..................... | H01J 37/321 156/345.48 |
| 2011/0104902 A1* | 5/2011 | Yamazawa | ............ | H01J 37/321 438/710 |
| 2011/0133950 A1* | 6/2011 | Subramanian | ............ | F01D 5/12 340/870.28 |
| 2012/0223304 A1* | 9/2012 | Yoneda | ............... | H01L 21/8252 257/43 |

OTHER PUBLICATIONS

Translasion of Foregn References cited in IDS,Chung et al. (KR 2007-0081209).*
International Search Report for PCT/KR2013/004333 filed May 16, 2013.

* cited by examiner

PLASMA EQUIPMENT

TECHNICAL FIELD

The present invention relates to plasma equipment, and more particularly, to plasma equipment capable of controlling plasma by applying a wireless power transmitting technology.

BACKGROUND ART

When a material in a solid phase is heated, the material is changed to a liquid phase and a gas phase in sequence. When energy is further applied to the material in the gas phase through heating or discharging, the gas is dissociated to atoms, ions and electrons which are smaller particles and the particles are mixed. This state is called plasma. Plasma that is industrially used is divided into low-temperature plasma and thermal plasma, and the low-temperature plasma (cold plasma) is widely used in a semiconductor manufacturing process, and the thermal plasma is applied in cutting and spraying.

A plasma generating method that is currently used the most in a semiconductor manufacturing process and display field uses a RF (Radio Frequency), and is largely divided into an inductively coupled plasma (ICP) method and a capacitively coupled plasma (CCP) method. In the inductively coupled plasma method, a coil type antenna is structurally used. When a RF power is applied to the antenna, a current flows in the antenna, and the current forms induced magnetic field around the antenna. At this time, positive charges and negative charges are alternately charged on a surface of the antenna by a RF frequency, so that a secondary induced current is allowed to flow around the antenna. In general, the inductively coupled plasma is generated by an induction coil in a frequency (13.56 MHz) domain generated by a quartz oscillator-type high-frequency generator by using an argon gas as a plasma gas.

In the inductively coupled plasma method, a RF current flows in the antenna for generating the inductively coupled plasma to form the magnetic field, and an induced electric field is formed by a time varying magnetic field to generate the plasma.

FIG. 1 is a diagram illustrating inductively coupled plasma equipment according to the related art, and FIG. 2 is a diagram illustrating an antenna used to generate inductively coupled plasma according to the related art. In FIG. 2, reference numeral "30" denotes a RF power supply.

In inductively coupled plasma equipment 10 according to the related art, a circular antenna 21 is used as illustrated in FIGS. 1 and 2, and efficiency of the entire power system may be decreased and space non-uniform of plasma P may be caused due to capacitive coupling caused by a high potential difference generated between both ends 22 and 23 of the antenna.

As illustrated in FIG. 1, a high voltage is applied between the antenna 21 and a wall 12 of a processing chamber 11, and strong capacitive coupling (CC) is generated between the antenna 21 and the wall 12 of the chamber to cause a loss due to a displacement current. For this reason, the wall 12 of the chamber may be damaged.

Further, the antenna 21 that is directly connected to the power supply 30 in a wired manner generates and controls inductively coupled plasma, and since the antenna is directly connected to the power supply, there is a limitation on an installation position of the antenna. Thus, the entire density of the plasma may be reduced.

In recent years, a size of a processing target or a substrate on which a depositing process or an etching process is performed by the plasma generated by the inductively coupled plasma equipment is gradually increased. However, when a large antenna corresponding to a large substrate is used, a standing wave effect may be exhibited.

Furthermore, as a need for the plasma process on the large substrate is increased, a need for uniformity of the plasma on a surface of the large substrate is also increased. However, when a single antenna is used, it is difficult to uniformly control the plasma, and when a plurality of antenna that is directly connected to the power supply in the wired manner is used, the plasma equipment may be complicated.

DISCLOSURE

Technical Problem

An object of the present invention is to provide plasma equipment capable of controlling plasma by using a resonance coil that is directly connected to a power supply in a wired manner in addition to an antenna coil that is directly not connected to the power supply in the wired manner.

An object of the present invention is to also provide plasma equipment capable of freely selecting an installation position of the resonance coil that generates or controls the plasma by using the resonance coil which is electrically insulated from the power supply or the antenna coil or wirelessly receives a power.

An object of the present invention is to also provide plasma equipment capable of improving uniformity of the plasma by using a plurality of resonance coils and changing magnitudes of currents flowing in the resonance coils.

An object of the present invention is to also provide plasma equipment capable of preventing a decrease in density of the plasma by using the resonance coil which is electrically connected to the power supply and receives the power from the antenna coil in a wireless power transmitting manner.

Technical Solution

In order to achieve the objects, an exemplary embodiment of the present invention provides plasma equipment including a power supply that supplies a RF power; a chamber in which plasma is generated, and a processing target to processed by the plasma is provided; an antenna coil that is provided on a top surface of the chamber, and is connected to the power supply to receive the RF power; and a resonance coil that is provided to be electrically insulated or cut off from the antenna coil. The resonance coil receives electromagnetic energy applied from the antenna coil to allow a current to flow, and the plasma is generated within the chamber.

In such a configuration, it is possible to generate or control the plasma by using the resonance of the resonance coil that is electrically insulated or cut off from the antenna coil. That is, it is possible to control the plasma through wireless power transmission between the antenna coil and the resonance coil.

The resonance coil may be provided at least two on the top surface of the chamber, and the antenna coil may be positioned between the resonance coils.

The resonance coil may be provided above the antenna coil so as to be spaced apart from the top surface of the chamber, and an auxiliary coil may be provided on the top surface of the chamber so as to be spaced apart from the resonance coil.

The auxiliary coil may allow the current flowing in the resonance coil to be uniform.

A variable capacitor may be connected to the resonance coil in parallel.

When the resonance coil causes resonance, electromagnetic energy of the antenna coil is received to allow the current to flow in the resonance coil.

The current flowing in the resonance coil may be varied depending on a value of the variable capacitor.

The resonance coil may be formed in a closed curved-line shape.

The variable capacitor may be respectively connected to the resonance coil in parallel.

The resonance coil may include a ferritic material, or is made of the ferritic material.

The resonance coil may come in contact with an outer surface of a top of the chamber, and may be formed in a plurality of ring shapes having the same center.

Advantageous Effects

As described above, according to the plasma equipment of the present invention, it is possible to control the plasma by using the resonance coil that is directly not connected to the power supply in the wired manner in addition to the antenna coil that is directly connected to the power supply in the wired manner.

According to the plasma equipment of the present invention, it is possible to increase the degree of freedom for the installation position of the resonance coil that generates or controls the plasma by using the resonance coil which is electrically insulated or cut off from the power supply or the antenna coil or wirelessly receives the power, and it is possible to increase the density of the plasma.

According to the plasma equipment of the present invention, it is possible to improve the uniformity of the plasma by using the plurality of resonance coils and changing the magnitudes of the currents flowing in the resonance coils.

According to the plasma equipment of the present invention, even when the size of the chamber is increased, since the plurality of resonance coils are used, it is possible to reduce influence of the standing wave effect.

According to the plasma equipment of the present invention, it is possible to improve the uniformity of the plasma in the rotational direction by providing the auxiliary coil that allows the current flowing in the resonance coil to be uniform below the resonance coil.

BEST MODE

Figure 1:
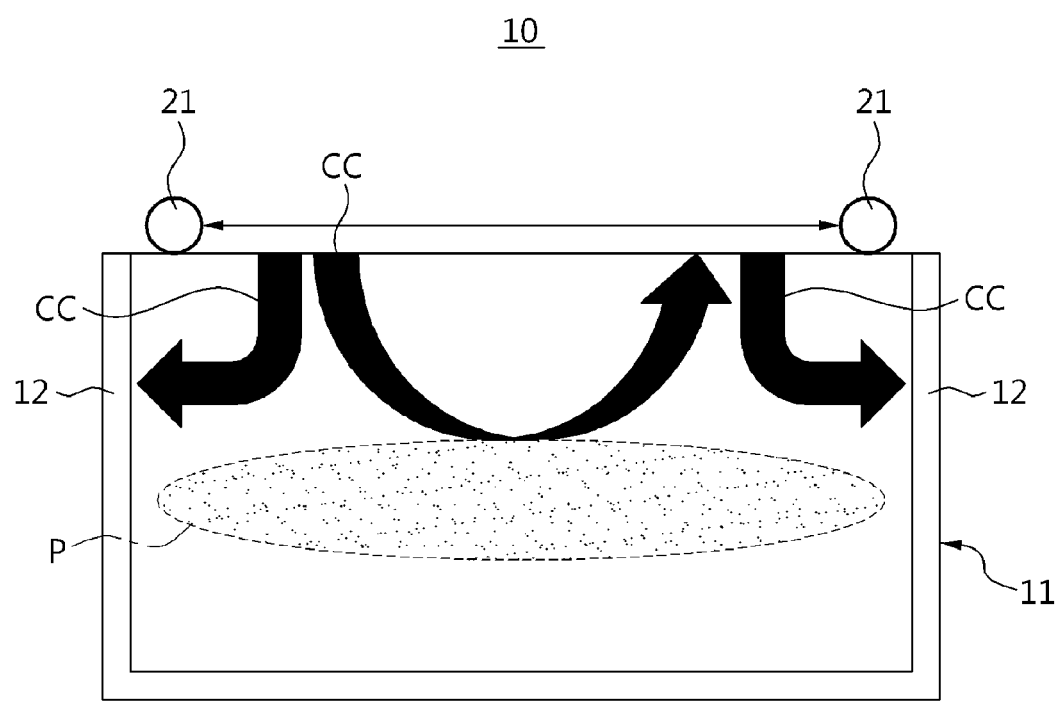
FIG. 1 is a diagram illustrating inductively coupled plasma equipment according to related art.
Figure 2:
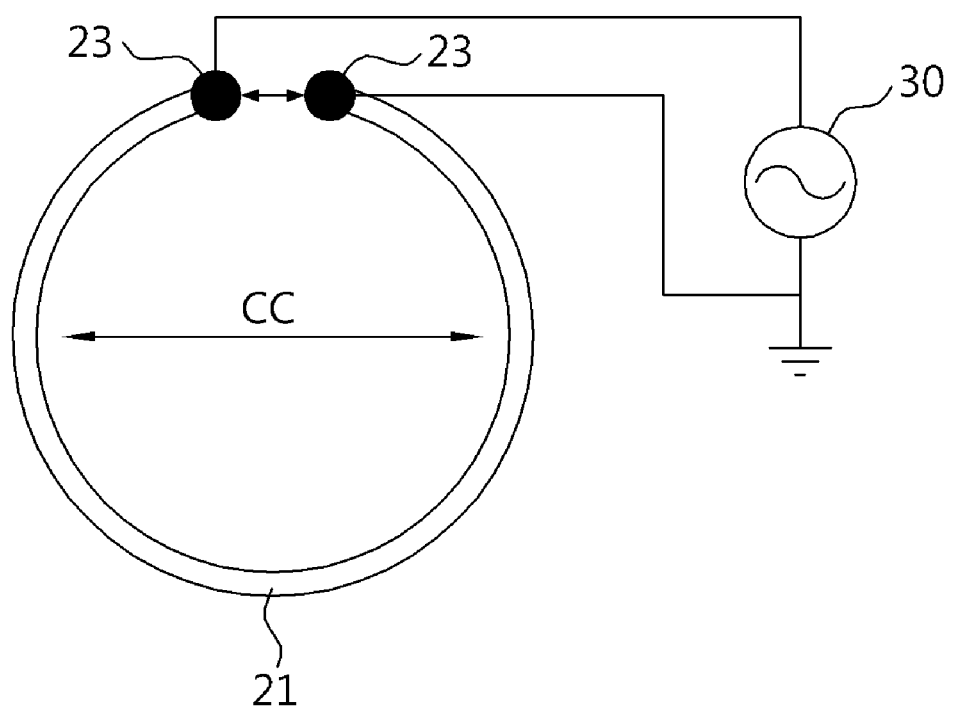
FIG. 2 is a diagram illustrating an antenna used to generate inductively coupled plasma according to the related art.

Hereinafter, embodiments of the present invention will be described in detail with reference to the accompanying drawings. However, the present invention is not limited or restricted to the embodiments. Throughout the drawings, the same reference numeral denotes the same part.

Figure 3:
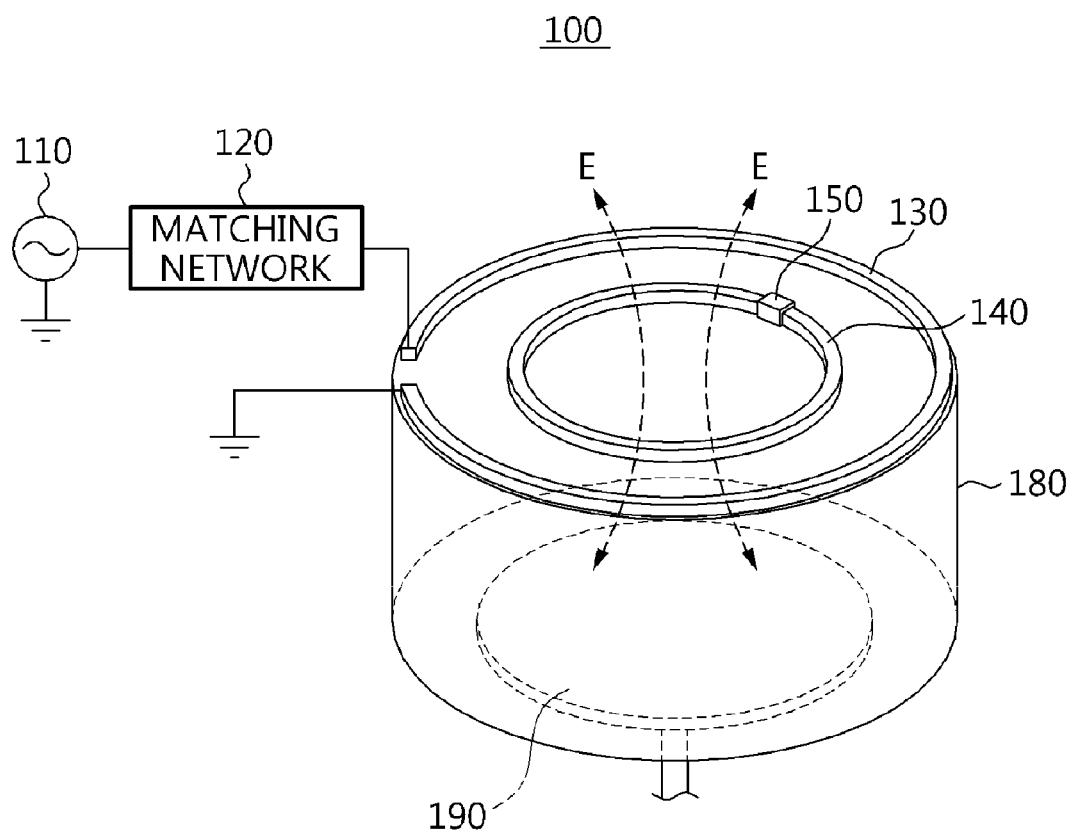
FIG. 3 is a schematic diagram of plasma equipment according to an embodiment of the present invention.
Figure 4:
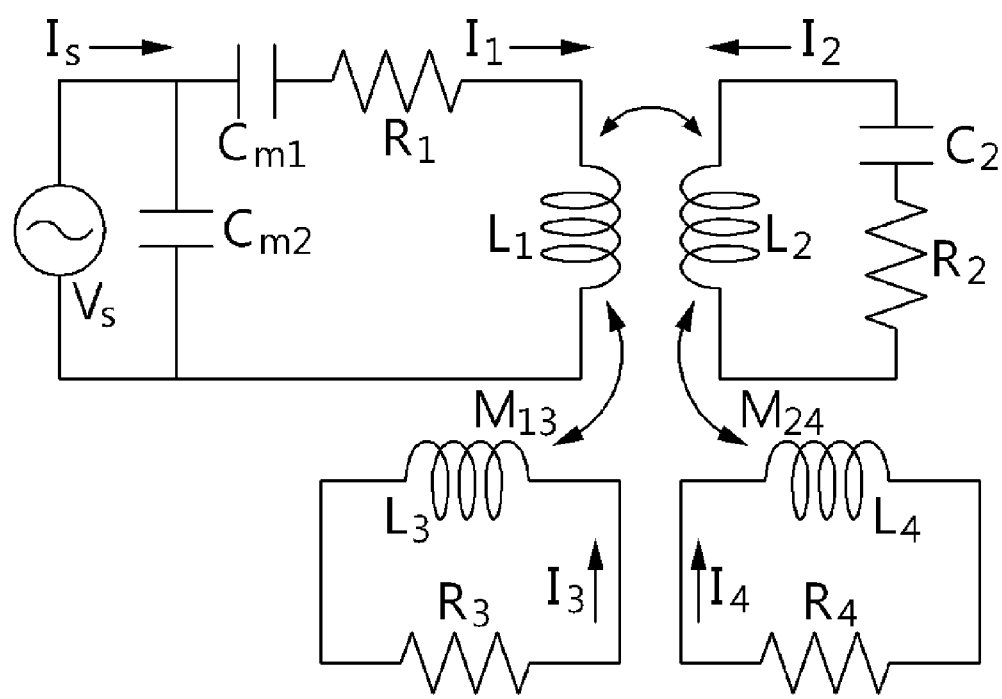
FIG. 4 is an equivalent circuit of the plasma equipment of FIG. 3.
Figure 5:
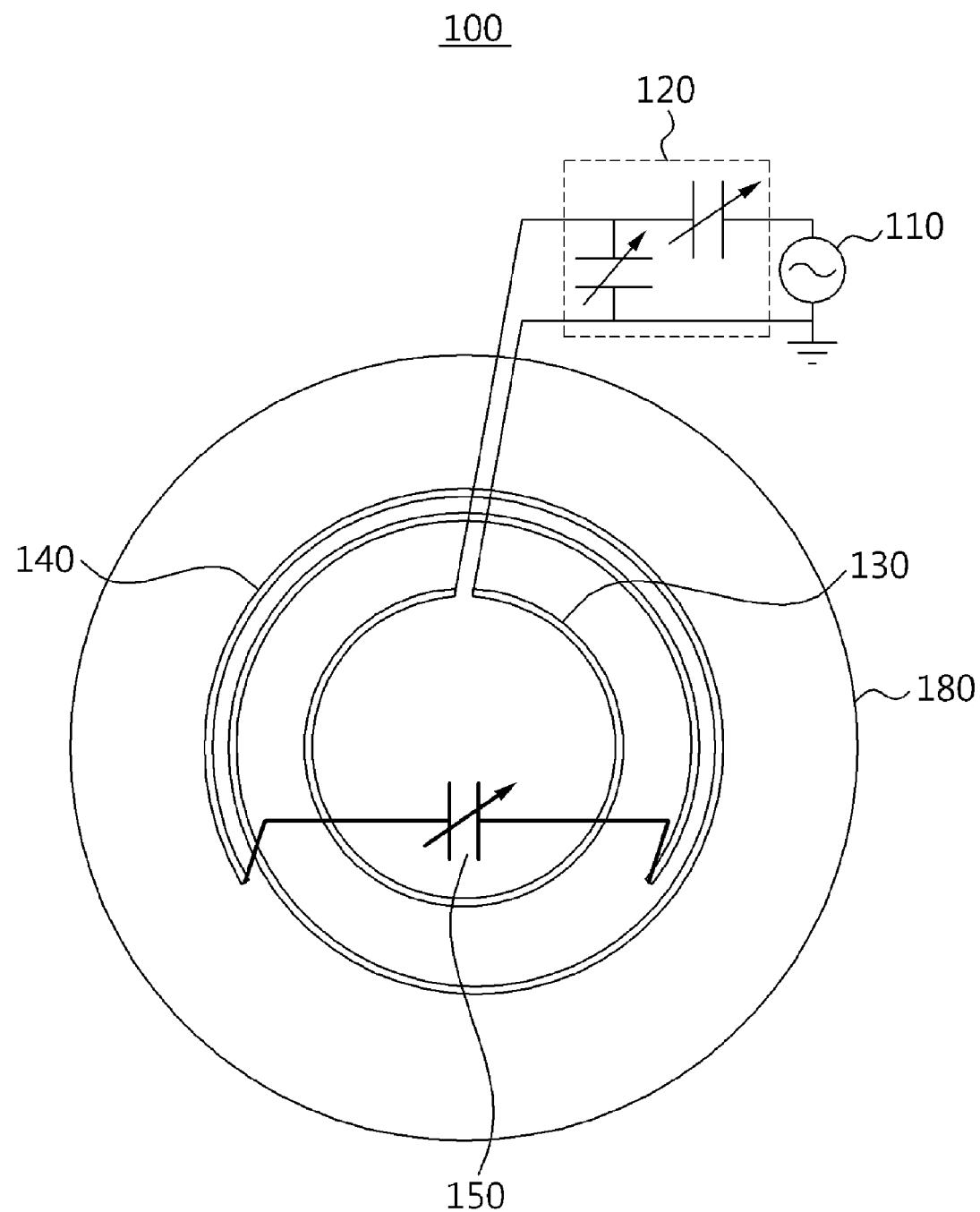
FIG. 5 is a diagram illustrating a state where a power supply of the plasma equipment of FIG. 3 is connected to an antenna coil, a resonance coil and a variable capacitor.
Figure 6:
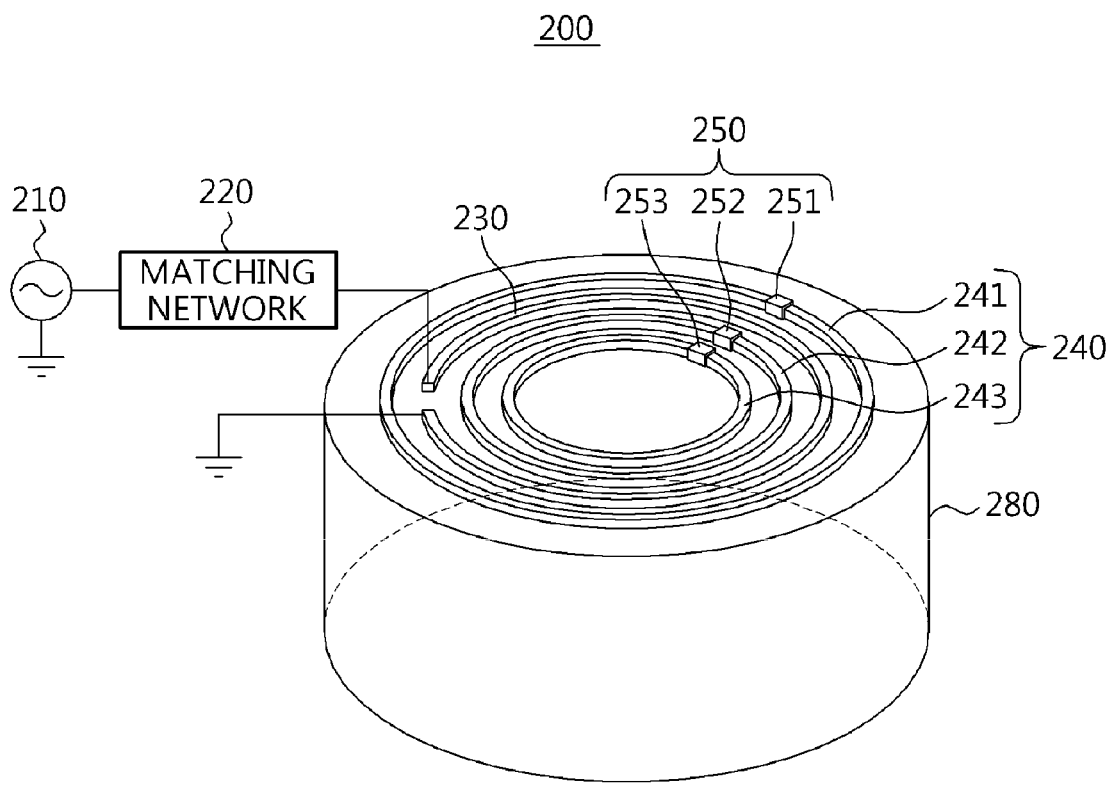
FIG. 6 is a schematic diagram of plasma equipment according to another embodiment of the present invention.
Figure 7:
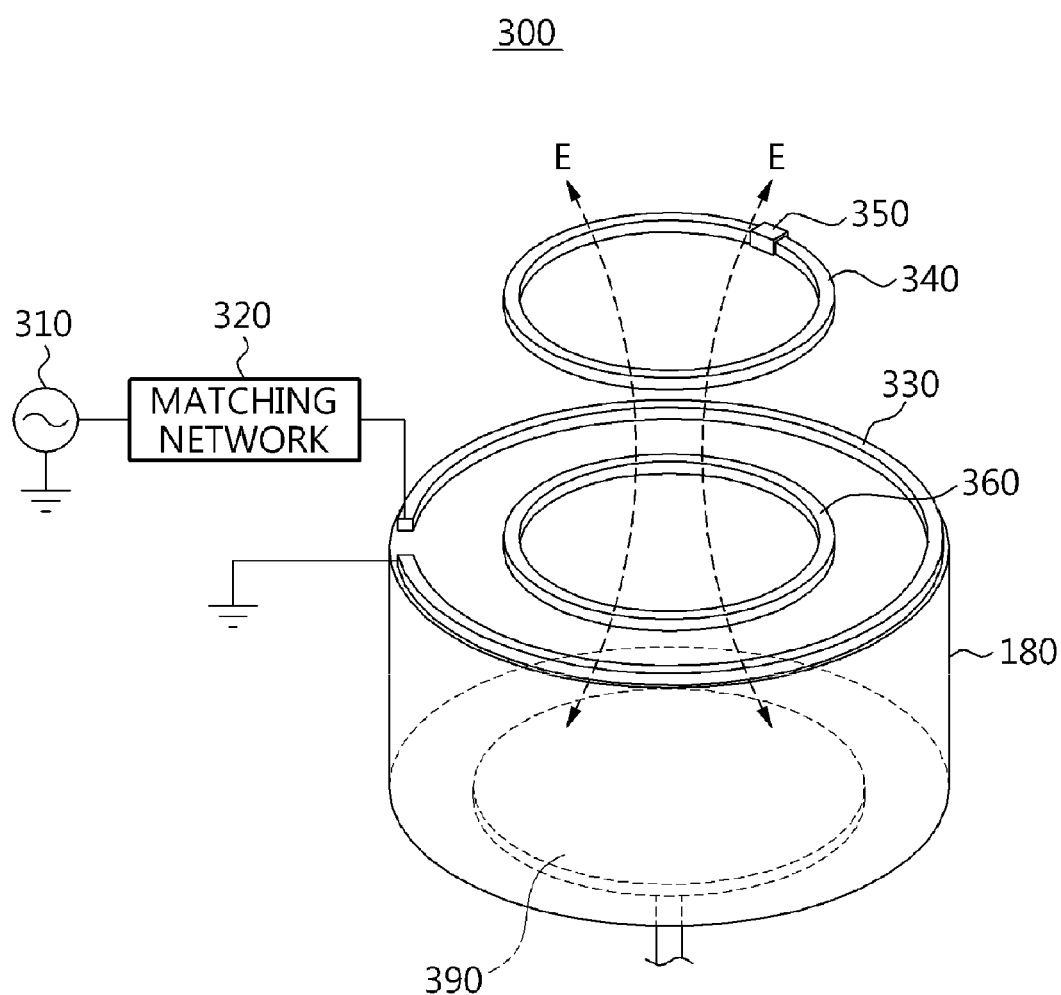
FIG. 7 is a schematic diagram of plasma equipment according to still another embodiment of the present invention.
Figure 8:
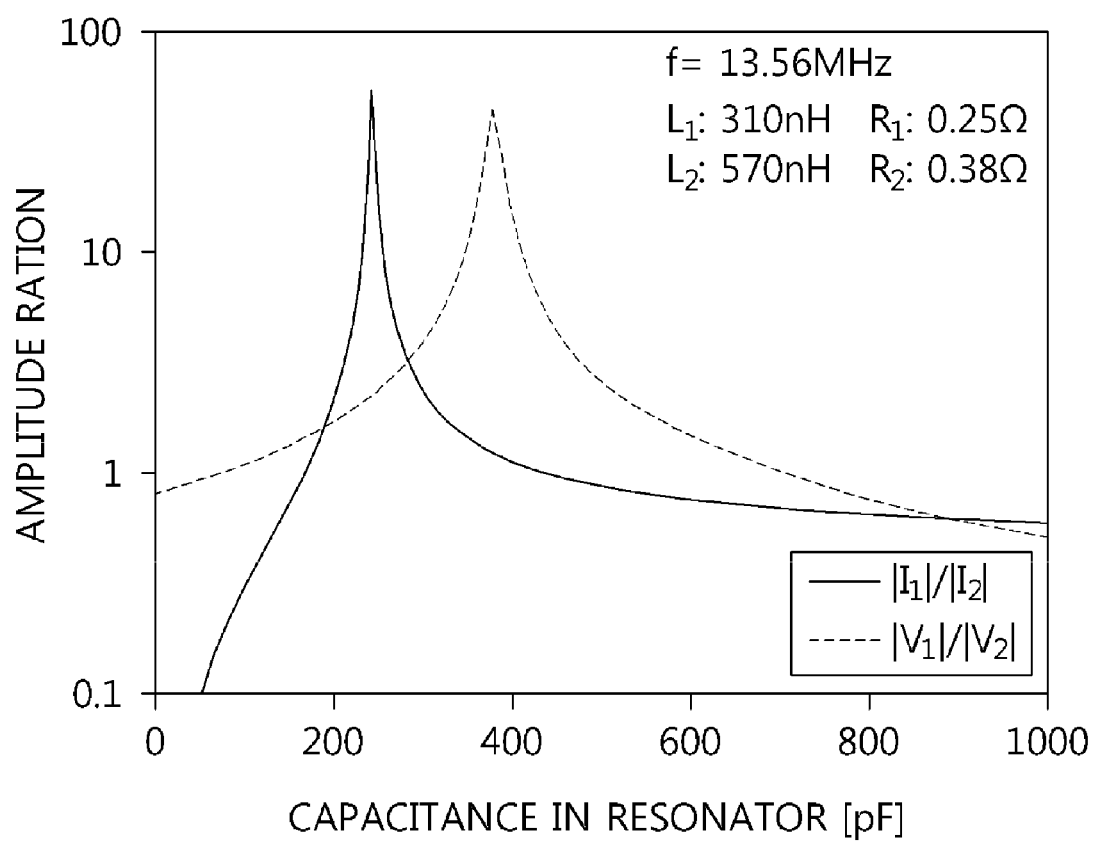
FIGS. 8 to 10 are graphs illustrating experimental data obtained by using the plasma equipment according to the present invention.
Figure 9:
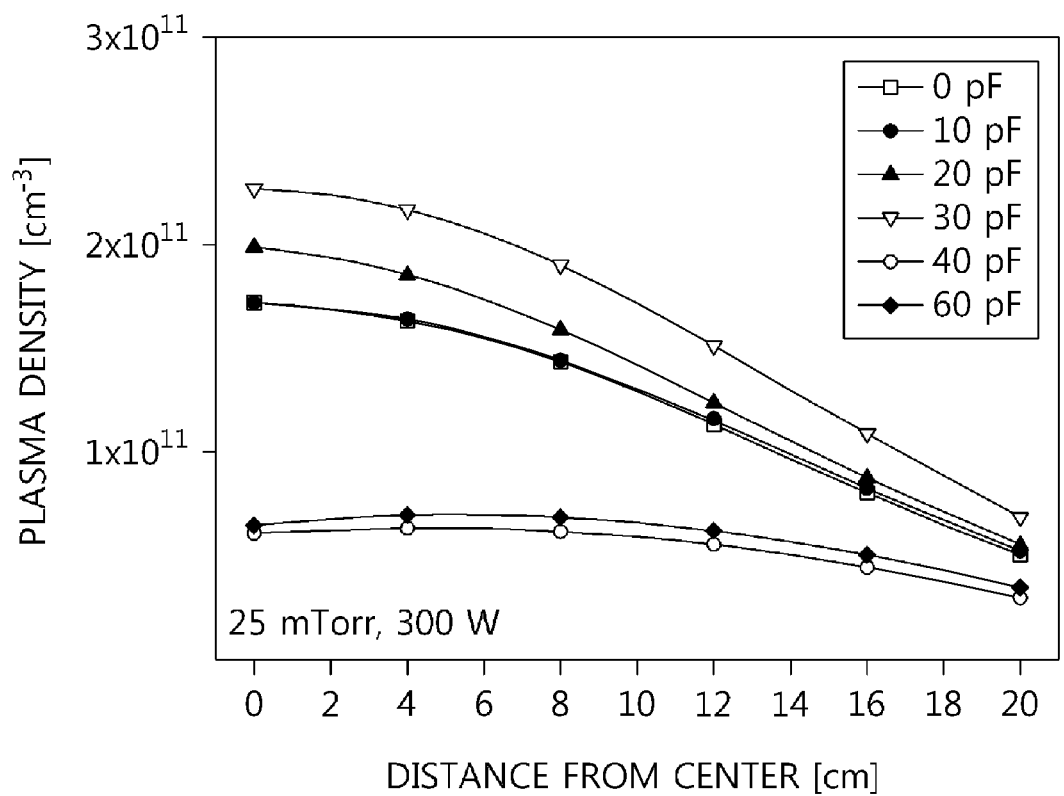
Figure 10:
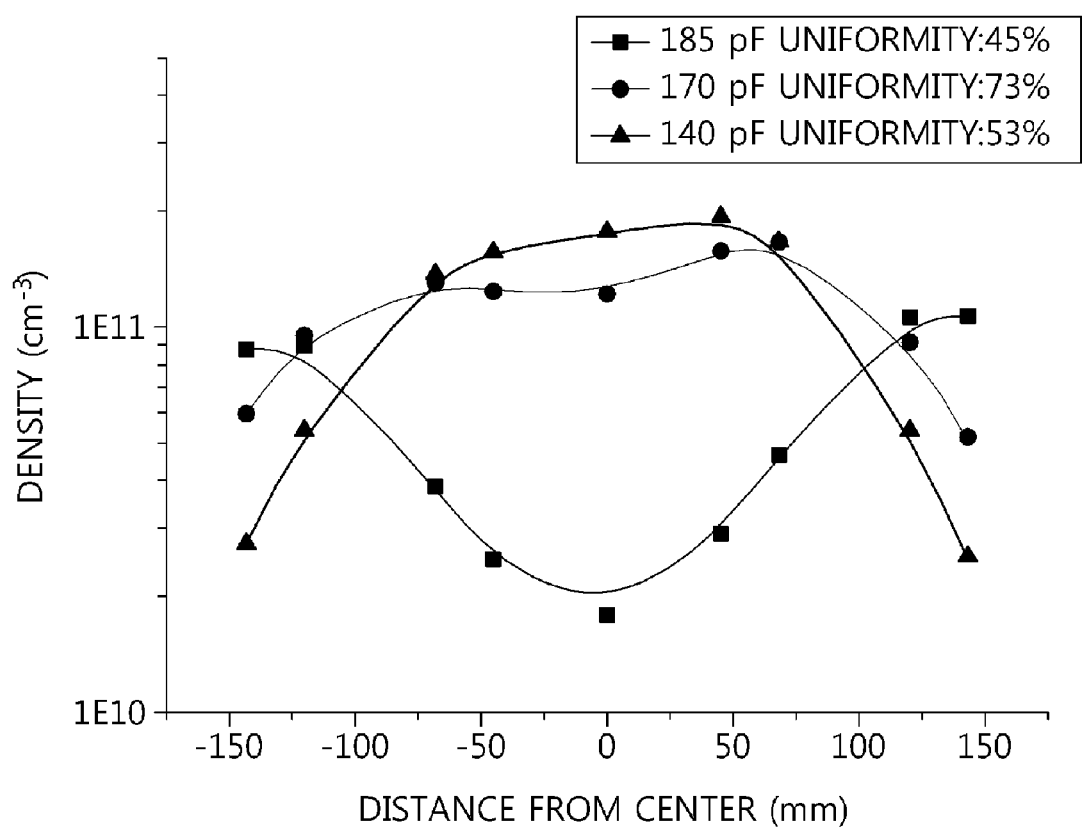

FIG. 3 is a schematic diagram of plasma equipment according to an embodiment of the present invention, FIG. 4 is an equivalent circuit of the plasma equipment of FIG. 3, FIG. 5 is a diagram illustrating a state where a power supply of the plasma equipment of FIG. 3 is connected to an antenna coil, a resonance coil and a variable capacitor, FIG. 6 is a schematic diagram of plasma equipment according to another embodiment of the present invention, FIG. 7 is a schematic diagram of plasma equipment according to still another embodiment of the present invention, and FIGS. 8 to 10 are graphs illustrating experimental data obtained by using the plasma equipment according to the present invention.

The plasma equipment according to the present invention may be applied to an inductively coupled plasma (ICP) method and a capacitively coupled plasma (CCP) method. For the sake of convenience in description, it will be described below that the plasma equipment according to the present invention is inductively coupled plasma equipment.

As illustrated in FIG. 1, inductively coupled plasma equipment 100 according to an embodiment of the present invention may include a power supply 110 that supplies a RF power, a chamber 180 in which plasma is generated and a processing target 190 to be processed by the generated plasma is provided, an antenna coil 130 that is provided on a top surface of the chamber 180 and is connected to the power supply 110 to receive the RF power, and a resonance coil 140 that is electrically insulated or electrically cut off from the antenna coil 130.

The plasma equipment 100 according to the embodiment of the present invention may generate the plasma by using a wireless power transmitting technology, and control a characteristic of the generated plasma.

The antenna coil 130 of the plasma equipment 100 according to the embodiment of the present invention may be directly connected to the power supply 110, and an impedance matching unit 120 may be provided between one end of the antenna coil 130 and the power supply 110. That is, the RF power of the power supply 110 which has passed through the impedance matching unit 120 may be applied to the antenna coil 130. The antenna coil 130 may be electrically connected to the power supply 110 or the impedance matching unit 120 in a direct wired manner. The antenna coil 130 is formed to come in contact with an outer surface of a top of the chamber 180.

Meanwhile, the resonance coil 140 may be formed inside or outside the antenna coil 130. Here, a shape of the antenna coil 130 or the resonance coil 140 is not limited, but may be preferably a closed curved-line shape such as a circular shape or a ring shape. It is appreciated that the shape of the antenna coil 130 or the resonance coil 140 is not limited.

Unlike the antenna coil 130, the resonance coil 140 may not be directly connected to the power supply 110 or the impedance matching unit 120 in the wired manner, or may not be electrically connected. That is, the resonance coil 140 is electrically insulated or electrically cut off from the power supply 110. As stated above, since the resonance coil 140 is electrically insulated or cut off from the power supply 110, the resonance coil 140 receives the power from the antenna coil 130 in a wireless power transmitting manner.

The resonance coil 140 may receive electromagnetic energy from the antenna coil 130 in the wireless power transmitting manner to allow a current to flow, and generate the plasma within the chamber 180.

In such a configuration, the plasma can be generated or controlled using resonance of the resonance coil 140 which is electrically insulated or cut off from the antenna coil 130. That is, the plasma can be controlled through the wireless power transmission between the antenna coil 130 and the resonance coil 140.

Since the resonance coil 140 is electrically insulated or cut off from the power supply 110 or the impedance matching unit 120 without being directly connected thereto in the wired manner, an installation position of the resonance coil 140 can be freely selected in installing the resonance coil 140 on the outer surface of the top of the chamber 180. As mentioned above, since the resonance coil 140 is installed at a position to be desired to control the plasma, it is possible to more precisely control the plasma.

When the resonance coil 140 causes resonance, electromagnetic energy E of the antenna coil 130 positioned outside the resonance coil 140 is applied to the resonance coil 140, and a current is allowed to flow in the resonance coil 140. At this time, a principle that the electromagnetic energy E of the antenna coil 130 positioned on the outside is applied to the resonance coil 140 may be the same as or similar to a wireless power transmitting principle.

In order for the resonance coil 140 to cause the resonance, a variable capacitor 150 may be connected to the resonance coil 140. As illustrated in FIGS. 4 and 5, the variable capacitor 150 is connected to the resonance coil 140 in parallel. Referring to FIG. 5, the resonance coil 140 itself may be formed in a closed curved-line, or the resonance coil and the variable capacitor 150 connected in parallel may be formed in a closed curved-line as a whole. Further, the resonance coil 140 may be wound one or more turns.

The current flowing in the resonance coil 140 that wirelessly receives the power from the antenna coil 130 to cause the resonance may be varied by adjusting a size of the variable capacitor 150. That is, the plasma generated within the chamber 180 can be controlled by adjusting the size of the variable capacitor 150.

In FIG. 3, reference numeral "190" denotes a processing target 190 on which a plasma process such as a depositing process or an etching process is performed by the generated plasma, and the processing target 190 may be mostly a substrate.

Meanwhile, at least two resonance coils 240 may be provided on a top surface of a chamber 280, and an antenna coil 230 may be positioned between the resonance coils 240. Referring to FIG. 6, plasma equipment 200 according to another embodiment of the present invention may include a plurality of resonance coils 240 provided on an outer surface of a top of the chamber 280.

The resonance coil 240 may include first to third resonance coils 241, 242 and 243 which come in contact with the outer surface of the top of the chamber 280. The first to third resonance coils 241, 242 and 243 are preferably formed in ring shapes having the same center. At this time, the number of the resonance coils 240 may be determined depending on a degree by which uniformity of the plasma generated within the chamber 280 is required.

The RF power of the power supply 210 which has passed the impedance matching unit 220 may be applied to the antenna coil 230. The antenna coil 230 may be electrically connected to the power supply 210 or the impedance matching unit 220 in the direct wired manner.

When the resonance coils 240 cause the resonance, the electromagnetic energy E of the antenna coil 230 between the resonance coils 240 is applied to the resonance coil 240 to allow currents to flow in the resonance coils 240. At this time, the principle that the electromagnetic energy E of the antenna coil 230 is applied to the resonance coil 240 may be the same as or similar to the wireless power transmitting principle.

Variable capacitors 250 may be connected to each of the resonance coils 240 in parallel so as to allow the resonance coils 240 to cause the resonance. That is, the first to third variable capacitors 251, 252 and 253 may be respectively connected to the first to third resonance coil 241, 242 and 243 in parallel. Magnitudes of the currents flowing in the resonance coils 241, 242 and 243 are changed using the variable capacitors 251, 252 and 253 of the resonance coil 241, 242 and 243, so that the plasma can be controlled.

In order to perform the plasma process on a large-diameter and large-area substrate, when a large-sized chamber 280 is used, the plurality of resonance coils 240 are preferably used to increase the uniformity of the plasma, as illustrated in FIG. 6. Moreover, as the size of the chamber 280 is increased, the plurality of resonance coils 240 is used, so that it is possible to reduce influence of a standing wave effect.

Referring to FIG. 6, it has been illustrated that the first to third variable capacitors 251, 252 and 253 that are connected to the first to third resonance coils 241, 242 and 243 in parallel are positioned at the same radius with respect to a center of the top surface of the chamber 280, but the plurality of variable capacitors 251, 252 and 253 are not necessarily positioned in the same line. In addition, the variable capacitors 250 may not be respectively connected to the resonance coils 240, but the plurality of variable capacitors may be connected to each of the resonance coils. When the plurality of variable capacitors is connected to each of the resonance coils 240, the same number of variable capacitors 250 is preferably connected to each of the resonance coils 240, and it is effect to arrange the plurality of variable capacitors 250 at the same interval.

Meanwhile, as illustrated in FIG. 7, a resonance coil 350 may be provided above an antenna coil 330 so as to be spaced apart from a top surface of a chamber 380, and an auxiliary coil (a rim shape) 360 may be provided on the top surface of the chamber 380. Plasma equipment 300 according to still another embodiment of the present invention illustrated in FIG. 7 includes the auxiliary coil 360 and the antenna coil 330 coming in contact with an outer surface of a top of the chamber 380, and a resonance coil 340 is provided at a position spaced apart from the outer surface of the top of the chamber 380. That is, the resonance coil 340 may be provided above the auxiliary coil 360.

A variable capacitor 350 is connected to the resonance coil 340 in parallel so as to cause the resonance, but the variable capacitor is not connected to the auxiliary coil 360. The antenna coil 330 has a non-closed curved-line shape in which both ends thereof are spaced apart from each other, and the resonance coil 340 and the auxiliary coil 360 have a closed curved-line shape. Preferably, the resonance coil 340 and the auxiliary coil 360 have a ring shape or a rim shape.

Here, the auxiliary coil 360 may uniformly form the current flowing in the resonance coil 340. That is, in order for the uniform current to flow in the resonance coil 340, the auxiliary coil 360 is used. It is possible to allow the current flowing in the closed loop to be uniform by positioning the resonance coil 340 in the closed loop. In such a method, it is possible to enhance the uniformity of the plasma in a rotational direction.

Referring to FIG. 7, a RF power of a power supply 310 which has passed through an impedance matching unit 320 may be applied to the antenna coil 330. The antenna coil 330 may be electrically connected to the power supply 310 or the impedance matching unit 320 in a direct wired manner.

When the resonance coil 340 causes the resonance, the electromagnetic energy E of the antenna coil 330 below the resonance coil 340 is applied to the resonance coil 340, so that the current is allowed to flow in the resonance coil 340. At this time, the principle that the electromagnetic energy E of the antenna coil 330 is applied to the resonance coil 340 may be the same as or similar to the wireless power transmitting principle.

The wireless power transmission by the resonance is performed between the antenna coil 330 and the resonance coil 340, and the wireless power transmission by the resonance is not performed between the antenna coil 330 and the auxiliary coil 360 or between the resonance coil 340 and the auxiliary coil 360. The auxiliary coil 360 is provided to uniformize the current of the resonance coil 340. As described above, it is possible to increase density of the plasma for performing the plasma process such as the depositing process or the etching process on a processing target 390 within the chamber 380 by using the antenna coil 330 and the auxiliary coil 360 positioned below the resonance coil 340.

When the resonance coil 140, 240 or 340 causes the resonance, the plasma equipment 100, 200 or 300 according to the present invention receives the electromagnetic energy of the antenna coil 130, 230 or 330 to allow the current to flow in the resonance coil 140, 240 or 340.

The current flowing in the resonance coil 140, 240 or 340 may be varied depending on the size of the variable capacitor 150, 250 or 350. The impedance matching unit 120, 220 or 320 may be provided between the one end of the antenna coil 130, 230 or 330 and the power supply 110, 210 or 310, and the other end of the antenna coil 130, 230 or 330 may be grounded.

The plasma equipment 100, 200 or 300 according to the present invention may set the resonance coil 140, 240 or 340 to a resonance frequency, and control the plasma while changing a frequency of the power supply 110, 210 or 310.

Meanwhile, in order to change the frequency of the power supply 140, 240 or 340 and to increase a Q-factor, a material such as ferrite may be used for the resonance coil 140, 240 or 340. That is, the resonance coil 140, 240 or 340 may include a ferritic material, or may be made of the ferritic material.

FIGS. 8 to 10 illustrate graphs of experimental data for experimenting performance of the plasma equipment 100, 200 or 300 according to the present invention.

FIG. 8 illustrates a relation between a value of the variable capacitor 150 and a current ratio ($|I_1|/|I_2|$) or a voltage ratio ($|V_1|/|V_2|$) in the equivalent circuit of FIG. 4. When the variable capacitor 150 has a value that causes the resonance with respect to a value of an inductance L1 or L2, the current ratio and the voltage ratio are the largest.

FIGS. 9 and 10 illustrate graphs representing plasma density with a distance from the center of the top surface of the chamber when the variable capacitor having a different value is used. Referring to FIG. 9, as the value of the variable capacitor is varied, the density of the plasma is changed, and when the value of the variable capacitor is 30 pF, the density of the plasma at the same distance is the largest. Here, when the variable capacitor has a value that causes the resonance of the resonance coil, the density of the plasma is the highest. Further, it can be seen that the density of the plasma is decreased as the distance from the center is long.

Unlike FIG. 9, FIG. 10 illustrates uniformity of the plasma as well as the density of the plasma. FIG. 10 illustrates experimental date under a pressure of 20 mTorr. Referring to FIG. 10, when the value of the variable capacitor is 170 pF, the uniformity and density of the plasma are relatively favorable.

As stated above, in accordance with the plasma equipment according to the present invention, an electromagnetic field distribution within the plasma by the antenna coil may be changed depending on the value of the variable capacitor, and the density of the plasma may be changed. Furthermore, since the plurality of resonance coils is used, it is possible to enhance the plasma uniformity, it is possible to prevent degradation of the uniformity even when the large-area plasma is used, and it is possible to freely select the installation position of the resonance coil.

The plasma equipment according to the present invention described above may be applied to the inductively coupled plasma (ICP) method and the capacitively coupled plasma (CCP) method.

As described above, although the embodiments of the present invention have been described in connection with particular terms such as specific components and restricted embodiments with reference to the accompanying drawings, the embodiments are merely presented to help understanding of the present invention, and the present invention is not limited to the embodiments. Those skilled in the art can change and modify the embodiments in various manners. Accordingly, it should be understood that the spirit of the present invention is not limited to the embodiments and the appended claims and their equivalents are possible without departing from the spirit and scope of the present invention.

INDUSTRIAL APPLICABILITY

The present invention is applicable to all industrial fields requiring plasma processing or a plasma process.

The invention claimed is:
1. Plasma equipment comprising:
a power supply that supplies a RF power;
a chamber configured to generate plasma and process a processing target by using the plasma;
an antenna coil that is provided on a top surface of the chamber, and is directly connected to the power supply to receive the RF power;
a resonance coil that is provided to be electrically insulated or separated from the antenna coil and provided to be not connected to the antenna coil and the power supply; and
a variable capacitor that is connected to the resonance coil in parallel so as to allow the resonance coil to cause an electromagnetic inductive resonance, wherein the resonance coil receives electromagnetic energy from the antenna coil in a wireless power transmitting manner by the electromagnetic inductive resonance to allow a current to flow, and the plasma is generated within the chamber, and the current flowing in the resonance coil that wirelessly receives the power from the antenna coil to cause the resonance may be varied by adjusting a size of the variable capacitor, and the plasma generated within the chamber can be controlled by adjusting the size of the variable capacitor.

2. The plasma equipment of claim 1, wherein the resonance coil is provided at least two on the top surface of the chamber, and the antenna coil is positioned between the resonance coils.

3. The plasma equipment of claim 1, wherein an auxiliary coil is provided on the top surface of the chamber and is provided to be separated from the antenna coil and the resonance coil, and the resonance coil is provided above the antenna coil so as to be spaced apart from the top surface of the chamber, and the resonance coil is provided above the auxiliary coil, and the variable capacitor is not connected to the auxiliary coil.

4. The plasma equipment of claim 3, wherein the auxiliary coil is formed in the same shape with the resonance coil and allows the current flowing in the resonance coil to be uniform, and a wireless power transmission by the electromagnetic inductive resonance is not performed between the antenna coil and the auxiliary coil or between the resonance coil and the auxiliary coil.

5. The plasma equipment of claim 1, wherein a plurality of the resonance coil and the variable capacitor are provided, and each variable capacitor is connected to each resonance coil, and same number of the variable capacitor is connected to each resonance coil.

6. The plasma equipment of claim 5, wherein the plurality of the variable capacitor are positioned at the same radius with respect to a center of the top surface of the chamber.

7. The plasma equipment of claim 6, wherein the current flowing in the resonance coil is varied depending on a value of the variable capacitor.

8. The plasma equipment of claim 7, wherein the resonance coil and the variable capacitor connected in parallel is formed in a closed curved-line shape as a whole.

9. The plasma equipment of claim 7, wherein the variable capacitor is respectively connected to the resonance coil in parallel.

10. The plasma equipment of claim 5, wherein the resonance coil includes a ferritic material, or is made of the ferritic material in order to change a frequency of the resonance coil and to increase a Q-factor.

11. The plasma equipment of claim 1, wherein the resonance coil comes in contact with an outer surface of a top of the chamber, and is formed in a plurality of ring shapes having the same center.

12. The plasma equipment of claim 1, wherein a frequency of the power supply may be changed according to a frequency of the resonance coil in order to control the plasma.

* * * * *